United States Patent [19]
Gordon et al.

[11] Patent Number: 5,362,676
[45] Date of Patent: Nov. 8, 1994

[54] PROGRAMMABLE INTERCONNECT STRUCTURES AND PROGRAMMABLE INTEGRATED CIRCUITS

[75] Inventors: Kathryn E. Gordon, Mountain View; Richard J. Wong, Milpitas, both of Calif.

[73] Assignee: QuickLogic Corporation, Santa Clara, Calif.

[21] Appl. No.: 920,971

[22] Filed: Jul. 28, 1992

Related U.S. Application Data

[60] Division of Ser. No. 874,983, Apr. 23, 1992, Pat. No. 5,196,724, which is a continuation of Ser. No. 691,950, Apr. 26, 1991, abandoned.

[51] Int. Cl.$^5$ .......................................... H01L 21/283
[52] U.S. Cl. .................................. 437/192; 437/922
[58] Field of Search ................. 437/192; 148/DIG. 55

[56] References Cited

U.S. PATENT DOCUMENTS

| | | |
|---|---|---|
| 3,675,090 | 7/1972 | Neale . |
| 3,792,319 | 2/1974 | Tsang . |
| 4,424,578 | 1/1984 | Miyamoto . |
| 4,458,297 | 7/1984 | Stopper et al. . |
| 4,499,557 | 2/1985 | Holmberg et al. . |
| 4,519,849 | 5/1985 | Korsh et al. . |
| 4,569,120 | 2/1986 | Stacy et al. . |
| 4,569,121 | 2/1986 | Lim et al. . |
| 4,590,589 | 5/1986 | Gerzberg . |
| 4,641,420 | 2/1987 | Lee . |
| 4,651,409 | 3/1987 | Ellsworth . |
| 4,751,197 | 6/1988 | Wills . |
| 4,758,745 | 7/1988 | Elgamal . |
| 4,823,181 | 4/1989 | Mohsen . |
| 4,847,732 | 7/1989 | Stopper . |
| 4,857,774 | 8/1989 | El-Ayat . |
| 4,862,243 | 8/1989 | Welch et al. . |
| 4,873,459 | 10/1989 | El Gamal . |
| 4,882,611 | 11/1989 | Blech et al. . |
| 4,898,841 | 2/1990 | Ho . |
| 4,910,417 | 3/1990 | El Gamal . |

(List continued on next page.)

FOREIGN PATENT DOCUMENTS 60-128640 7/1985 Japan .
02-146745 6/1990 Japan .

OTHER PUBLICATIONS

Brian Cook et al., "Amorphous Silicon Antifuse Technology for Bipolar PROMs", 1986 Bipolar Circuits and Technology Meeting, IEEE 1986, pp. 99–100.

(List continued on next page.)

*Primary Examiner*—Olik Chaudhuri
*Assistant Examiner*—C. Everhart
*Attorney, Agent, or Firm*—Skjerven, Morrill, Macpherson, Franklin & Friel

[57] ABSTRACT

An amorphous silicon antifuse has a bottom electrode, a dielectric overlying the bottom electrode, amorphous silicon contacting the bottom electrode in a via in the dielectric, and the top electrode over the amorphous silicon. Spacers are provided in the via corners between the amorphous silicon and the top electrode. The spacers smooth the surface above the amorphous silicon, provide good top electrode step coverage, and reduce leakage current. Another amorphous silicon antifuse is provided in which the amorphous silicon layer is planar. The planarity makes the amorphous silicon layer easy to manufacture. A programmable CMOS circuit is provided in which the antifuses are formed over the intermetal dielectric. The antifuses are not affected by the high temperatures associated with the formation of the intermetal dielectric and the first-metal contacts. The intermetal dielectric protects the circuit elements during the antifuse formation. The bottom electrodes of the antifuses are connected to the first-metal contacts. The overall capacitance associated with the antifuses is low, and hence the circuit is fast.

33 Claims, 5 Drawing Sheets

U.S. PATENT DOCUMENTS

| | | |
|---|---|---|
| 4,914,055 | 4/1990 | Gordon . |
| 4,922,319 | 5/1990 | Fukushima . |
| 4,933,898 | 6/1990 | Gilberg et al. . |
| 4,943,538 | 7/1990 | Mohsen et al. . |
| 4,949,084 | 8/1990 | Schwartz et al. . |
| 4,962,414 | 10/1990 | Liou et al. . |
| 5,011,791 | 4/1991 | Mastroianni . |
| 5,066,612 | 11/1991 | Ohba et al. . |
| 5,100,827 | 3/1992 | Lytle . |
| 5,106,773 | 4/1992 | Chen et al. . |
| 5,120,679 | 6/1992 | Boardman et al. ............ 437/192 |
| 5,181,096 | 1/1993 | Forouhi . |

OTHER PUBLICATIONS

R. V. Joshi et al., "Low-Resistance Submicron CVD W Interlevel Via Plugs on Al-Cu-Si", Jun. 12-13, 1989 Conference, IEEE 1989, pp. 113-121.

T. Ohba et al., "Selective and Blanket Tungsten Interconnection and its Suitability for 0.2-Micron ULSI", Jun. 12-13, 1990 VMIC Conference, IEEE 1990, pp. 226-232.

E. Hamdy et al., "Dielectric Based Antifuse for Logic and Memory ICs", IEDM 1988, pp. 786-789.

J. M. F. G. van Laarhoven et al., "A Novel Blanket Tungsten Etchback Scheme", Jun. 12-13, 1989 VMIC Conference, IEEE 1989, pp. 129-135.

A. C. Adams, "Plasma Deposition of Inorganic Films", Solid State Technology, Apr. 1983, pp. 135-139.

IBM Technical Disclosure Bulletin, vol. 14, No. 11, Apr. 1972, "Discretionary Interconnection Method for Integrated Circuits", pp. 3549-3550.

T. Moriya et al., "A Planar metallization Process-Its Application to Tri-Level Aluminum Interconnects," IEDM 83 (Dec. 1983) pp. 550-553.

PROGRAMMABLE INTERCONNECT STRUCTURES AND PROGRAMMABLE INTEGRATED CIRCUITS

This application is a division of application Ser. No. 07/874,983, filed Apr. 23, 1992, now U.S. Pat. No. 5,196,724, which is a continuation of application Ser. No. 07/691,950, filed Apr. 26, 1991, now abandoned.

BACKGROUND OF THE INVENTION

1. Field of the Invention

The present invention relates to programmable integrated circuit structures and methods for fabrication thereof, and more particularly to amorphous silicon antifuses and circuits and routing structures incorporating antifuses, and methods for fabrication thereof.

2. Description of Related Art

Programmable semiconductor devices include programmable read only memories ("PROMs"), programmable logic devices ("PLDs"), and programmable gate arrays. Programmable elements suitable for one or more of these device types include fuses and antifuses.

A fuse is a structure which electrically couples a first terminal to a second terminal, but which, when programmed by passage of sufficient current between its terminals, electrically decouples the first terminal from the second terminal.

An antifuse is a structure which when unprogrammed does not electrically couple its first and second terminals, but which, when programmed by applying sufficient voltage between the first and second terminals, permanently electrically connects the first and second terminals. One type of antifuse comprises an amorphous silicon which forms conductive polysilicon when heated.

Figure 1:
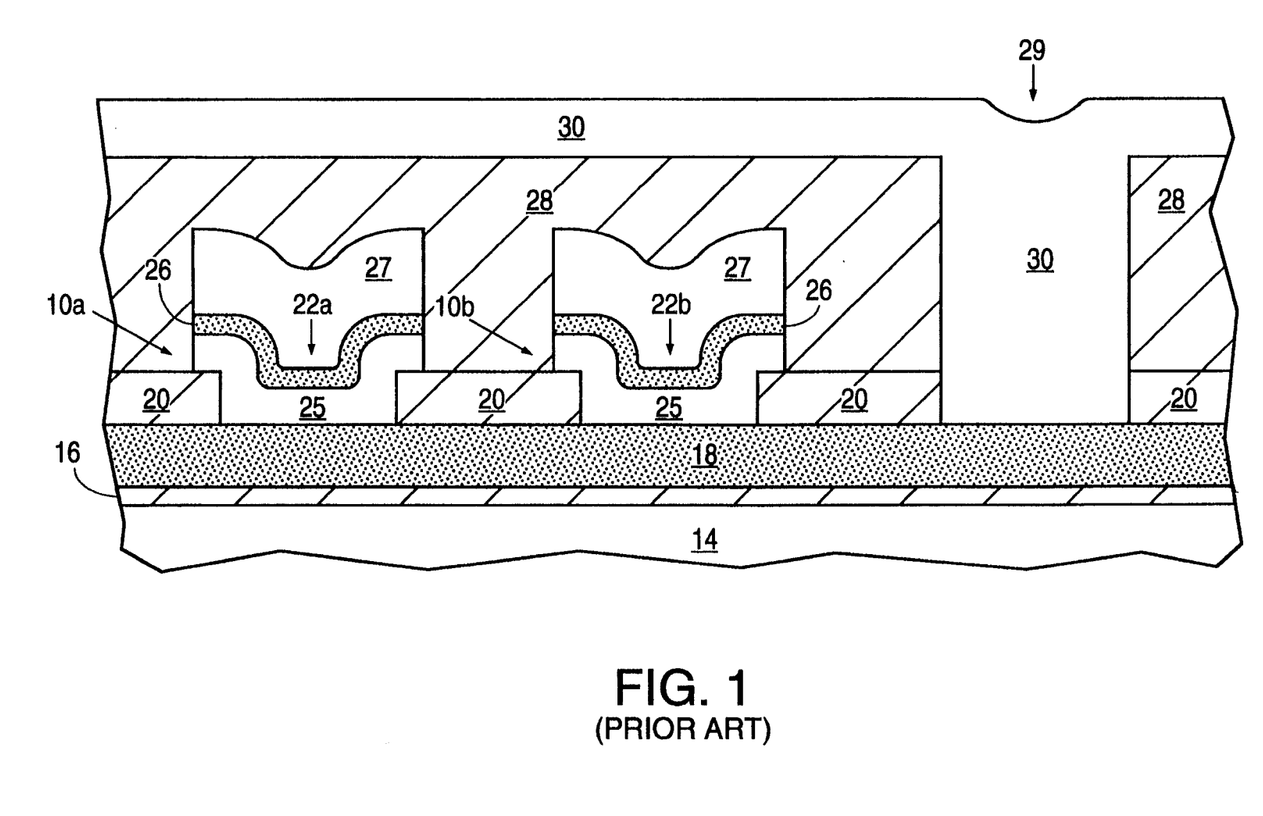
FIGS. 1 is a cross-section illustration of a portion of a prior art CMOS integrated circuit having amorphous silicon antifuses.

FIG. 1 illustrates an example of antifuse technology for a CMOS circuit. Antifuses 10a and 10b are part of an array of such antifuses that are formed on a silicon semiconductor substrate 14 over an oxide layer 16 using the following process steps. The first layer 18 of TiW is deposited over the entire surface of the substrate 14 and over one or more circuit elements (not shown) which are formed on the substrate 14 by standard CMOS process including steps up to the first metal deposition. The first TiW layer 18 serves two purposes: one, as a protective cover for CMOS transistors (not shown) while antifuses 10 are being formed, and the other is to provide the bottom electrode for antifuses 10. Portions of the first TiW layer 18 are appropriately masked, and the first etch of TiW 18 is performed to define the protective cover and the bottom electrodes.

A layer of dielectric material 20 such as 2000 angstroms of oxide is formed over the TiW layer 18 and then masked and etched to define antifuse vias 22a and 22b. The dielectric 20 is removed over those portions of the first TiW layer 18 which cover and protect the CMOS circuit elements.

A layer 25 of 1500 angstroms of amorphous silicon is deposited over the substrate 14. A second layer 26 of TiW is deposited over the amorphous silicon layer 25. The two layers are masked and etched to define the array of antifuses such as typically shown as 10a, 10b.

Then the structure is masked, and a second etch of the TiW layer 18 is performed to remove the portion of TiW layer 18 that has served as a protective cover for the CMOS circuit elements.

Then first-metal aluminum 27 is formed on the second layer 26 of TiW for each respective antifuse structure 10 when the first metallization for the integrated circuit components is formed. Metal layers 26, 27 provide the top electrodes to antifuses 10.

A standard intermetal dielectric layer 28 is formed over the wafer. Vias like via 29 are etched through dielectric layers 28 and 20 to the first TiW layer 18. A conductor 30 of second-metal aluminum is formed over the dielectric layer 28 and in vias 29. Portions of conductor 30 in vias 29 provide connections between the bottom electrodes 18 and the second metal 30 so as to reduce the connection resistance to the antifuses 10. See generally U.S. Pat. No. 4,914,055 issued Apr. 3, 1990 to Gordon et al.

It is generally desirable to provide a good step coverage when metal is deposited in vias. It is also desirable to protect the structure elements from high temperatures present during manufacturing. Further, it is desirable to maintain the number of etch steps as low as possible. It is also desirable to reduce the circuit capacitance in order to increase the circuit speed.

SUMMARY OF THE INVENTION

The present invention provides an amorphous silicon antifuse with consistent, reproducible electrical characteristics. In some embodiments, good top electrode step coverage is achieved by providing spacers on via sidewalls over the amorphous silicon before depositing the top electrode in the via. In addition to achieving good step coverage, the spacers reduce the leakage current in some embodiments.

The present invention also provides embodiments in which the amorphous silicon layer is planar. High quality deposition of the amorphous silicon is facilitated because the amorphous silicon is planar.

The present invention provides also programmable circuits using antifuses. In particular, CMOS circuits, including gate arrays, are provided. In some embodiments, the antifuses are formed over the intermetal dielectric. These antifuses are not exposed to the high temperatures present during the formation of the intermetal dielectric and the first-metal contacts. Further, since the intermetal dielectric protects the circuit elements during the antifuse formation, no special protective cover is required. In particular the bottom electrode layer is not used as a protective cover in some embodiments.

In some programmable circuits of the invention the connection resistance to the antifuses is reduced by connecting the bottom electrodes to the lower metal layer. The bottom electrodes which overlay the intermetal dielectric are positioned in the middle between the lower metal layer from which first-metal contacts are formed, and the top-electrode layer. The bottom electrodes are connected to the lower metal layer. The circuit has smaller overall capacitance since the capacitance between the bottom electrodes and the lower metal layer is zero. As the capacitance is low, the circuit is fast.

These and other advantages are achieved in the present invention, a method for fabricating a programmable interconnect structure for an integrated circuit. The method generally includes the steps of fabricating a first conductor; fabricating an insulating layer overlaying said first conductor; fabricating an opening through the insulated layer at a selected location and terminating the opening at a portion of the first conductor; depositing a film of amorphous silicon upon the insulating layer in the opening; patterning the amorphous silicon film to form at the selected location an amorphous silicon feature substantially restricted to the opening, the feature having a region contacting and fully overlaying the first conductor portion; fabricating spacers on sidewalls of the opening, the spacers overlaying at least a portion of the amorphous silicon film; and fabricating a second conductor, wherein a portion of the second conductor contacts and overlays the amorphous silicon region and wherein a portion of the second conductor overlays the spacers.

In another embodiment, a method for fabricating a programmable interconnect structure for an integrated circuit generally includes the steps of fabricating a first conductor; depositing a film of amorphous silicon upon the first conductor; fabricating an insulating layer overlaying the amorphous silicon film; fabricating an opening through the insulating layer at a selected location and terminating the opening at a portion of the amorphous silicon film; and fabricating a second conductor in the opening, wherein a portion of the second conductor contacts and overlays at least a portion of the amorphous silicon film.

The invention also provides programmable interconnect structures, circuits such as gate arrays, and methods of fabricating such structures and circuits.

BRIEF DESCRIPTION OF THE DRAWINGS

In the drawings, where like referenced numerals indicate like parts.

DESCRIPTION OF THE PREFERRED EMBODIMENTS

We have discovered that some prior art antifuse circuits including the prior art of FIG. 1 have certain disadvantages. In particular, a general problem is obtaining a good step coverage of the top electrode in the antifuse via. For example, in FIG. 1, the reproducibility and the electrical characteristics of antifuses 10 depend on obtaining a good step coverage of the second TiW layer 26 in vias 22.

Further, in some prior art processes including the process of FIG. 1, high temperatures of the process adversely affect the amorphous silicon of the antifuses. For example, the high temperatures present during the formation of the intermetal dielectric such as dielectric 28 and the top electrode layers such as layers 26, 27 and 30 change the structure and resistivity of the amorphous silicon and, consequently, the electrical characteristics of the antifuses.

Further, in some prior art including the prior art of FIG. 1, a special protective cover protects the circuit elements during formation of antifuses. For example, in FIG. 1, bottom electrode layer 18 is used as a protective cover. This necessitates an extra etch step to remove the protective cover.

Further, in some prior art including the prior art of FIG. 1, the circuit speed suffers from excessive capacitance associated with the metal layers of the circuit. For example, in FIG. 1, the middle metal layer that comprises TiW 26 and aluminum 27 may have a different potential than the bottom layer 18 and the top layer 30. Thus, the following capacitances slow down the circuit: (1) the capacitance between the middle layer 26, 27, and the bottom layer 18; and (2) the capacitance between the middle layer 26, 27 and the top layer 30.

The present invention eliminates some of the disadvantages of the prior art circuits.

Figure 2:
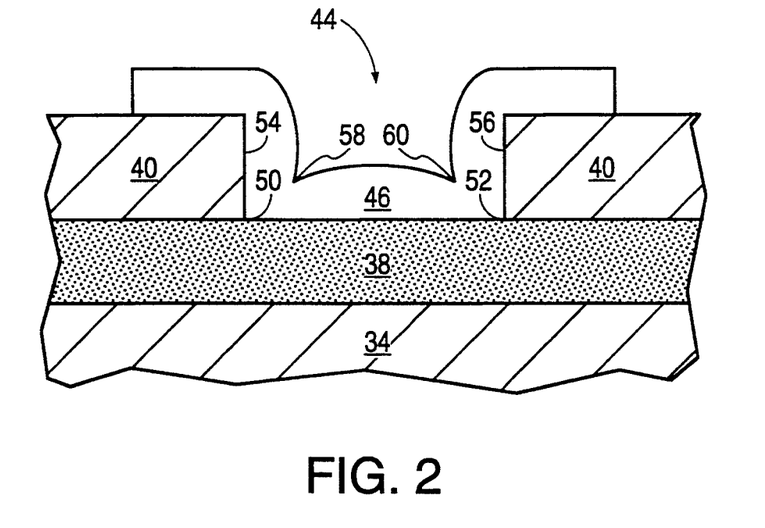
FIGS. 2-4 are cross-section illustrations of intermediary structures of the process of manufacturing an amorphous silicon antifuse according to the present invention.
Figure 5:
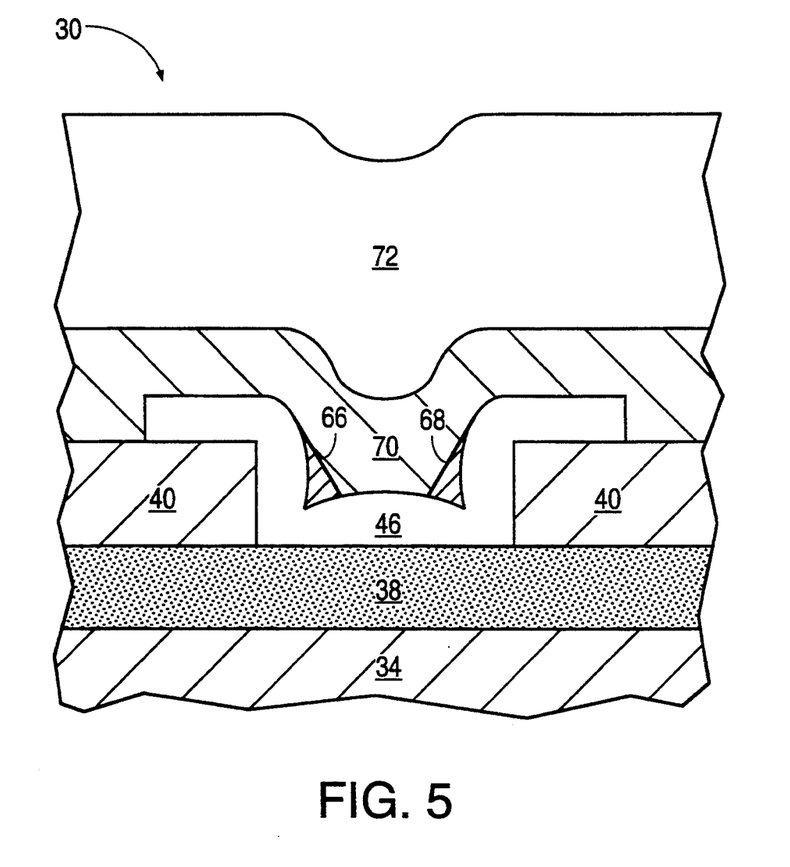
FIG. 5 is a cross-section illustration of an amorphous silicon antifuse of the present invention.

FIGS. 2-5 illustrate the basic steps of fabricating an amorphous silicon antifuse suitable for use with programmable semiconductor devices. The final structure, amorphous silicon antifuse 30, is illustrated in FIG. 5. As illustrated in FIG. 2, a first dielectric layer 34, typically of silicon dioxide, is formed on a silicon substrate (not shown), and patterned to expose portions of the substrate. Alternatively, the dielectric layer 34 may be formed upon a lower conductive layer (not shown) rather than on the substrate. A first conductive layer 38 is formed on dielectric layer 34 and patterned to form appropriate interconnects. The first conductive layer 38 provides the bottom electrode of antifuse 30. In one embodiment, the first conductive layer 38 is a layer of a barrier metal such as titanium tungsten (TiW), about 2000 angstroms thick, deposited by sputtering. Other conductive materials may also be used.

A second dielectric layer 40 is formed on the first conductive layer 38. In one embodiment, the second dielectric layer 40 is a layer of silicon dioxide, about 3000 angstroms thick, deposited using plasma enhanced chemical vapor deposition ("PECVD"). The second dielectric layer 40 is patterned to form vias, such as via 44, exposing first conductive layer 38. Some of these vias, in particular via 44, will serve as sites for antifuses. Other vias, not shown, may allow for direct connection between first conductive layer 38 and a to-be-formed second conductive layer.

A layer 46 of amorphous silicon is deposited and patterned over antifuse via 44. As is explained in U.S. patent application Se. No. 07/447,969 filed Dec. 8, 1989 whose disclosure is hereby incorporated herein by reference thereto, the thickness of amorphous silicon layer 46 in contact with first conductive layer 38 at the bottom of antifuse via 44 is an important factor in controlling the programming voltage of the antifuse. In this embodiment, the thickness of amorphous silicon layer 46 is about 1600 angstroms, which results in a programming voltage of about 12 volts. Of course, other programming voltages may be achieved by depositing the amorphous silicon layer 46 to an appropriate thickness. Further, layer thickness and feature size are selected to minimize leakage current, consistent with the process used and the programming voltage desired. In the present embodiment, the feature size is about 1.2 μm and, as has been mentioned, the layer thickness is 1600 angstroms.

In one embodiment, the amorphous silicon layer 46 is deposited using plasma enhanced chemical vapor deposition ("PECVD"). A suitable reactor is the Concept One reactor available from Novellus Systems, Inc., San Jose, Calif. The process reactants are SiH4 and argon. The reaction is carried out at a temperature of 400° C. In general, temperatures within the range of about 200° C. to about 500° C. are believed suitable. The resultant deposition and evolved by-products are amorphous silicon and hydrogen.

Amorphous silicon formation by PECVD is described generally in A. C. Adams, "Plasma Deposition of Inorganic Films," Solid State Technology, April 1983, p 135, hereby incorporated herein by reference thereto.

The structure is now prepared for the top electrode deposition. The following goals are addressed. One goal is obtaining a consistently good step coverage. The step coverage problem is exacerbated in some variations by thinning of the amorphous silicon 46 in bottom corners 50 and 52 formed by respective sidewalls 54 and 56 and the bottom of via 44. Another goal in such variations is to reduce the leakage current through thinner portions 58 and 60 of amorphous silicon 46 in the bottom corners 50 and 52.

Figure 3:
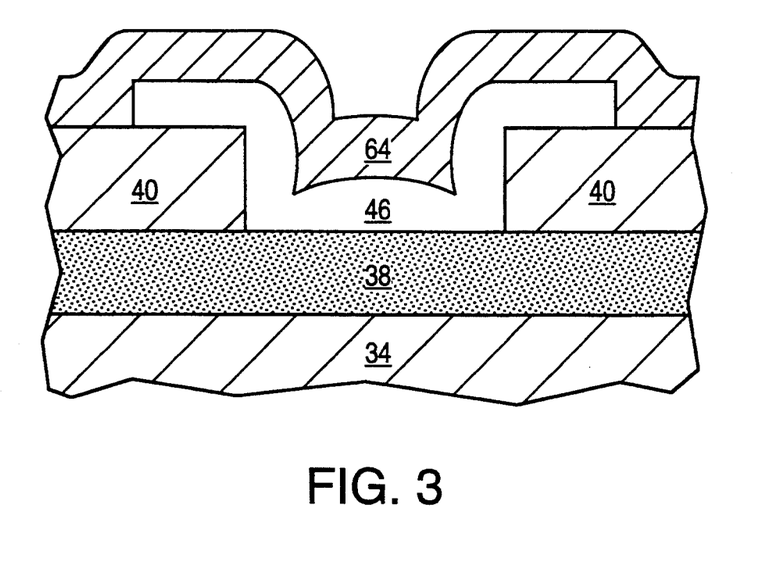
Figure 4:
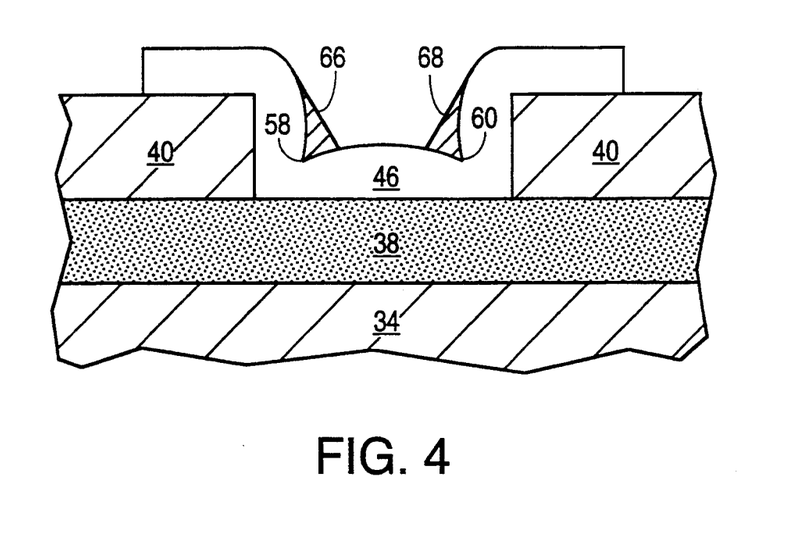

In the present embodiment, these goals are achieved by providing spacers on the sidewalls of via 44. As shown in FIG. 3, a substantially conformal layer 64 of silicon dioxide, about 2000 angstroms thick, is deposited by PECVD over the amorphous silicon 46. A suitable reactor is the concept One reactor described hereinabove. The process reactants are SiH4 and oxygen. The deposition is carried out at 400° C. Layer 64 is etched using reactive ion etching ("RIE") to form spacers 66 and 68 (FIG. 4) over the respective thinner portions 58 and 60. Spacers 66 and 68 smooth the surface above the amorphous silicon layer 46 and thus improve the top electrode step coverage. Further, spacers 66 and 68 reduce leakage current.

In one embodiment, silicon nitride is used instead of silicon dioxide in layer 64.

The top electrode formation is illustrated in FIG. 5. An about 2000 angstrom layer 70 of titanium tungsten (TiW) and an about 8000 angstrom layer 72 of aluminum-copper (AlCu) are sputter deposited and patterned to form the top electrode. TiW layer 70 serves as a barrier metal to prevent the aluminum of AlCu layer 72 from spiking into amorphous silicon 46. Aluminum spikes would increase the leakage current or even short the antifuse 30. Spacers 66 and 68 smooth the topography and improve the TiW layer 70 step coverage.

In some embodiments, spacers are used with variations of other silicon antifuses disclosed in the above mentioned application Ser. No. 07/447,969. The spacers over amorphous silicon smooth the surface above the amorphous silicon layer in and adjacent the via corners. The spacers improve the barrier metal step coverage and decrease leakage current.

Figure 6:
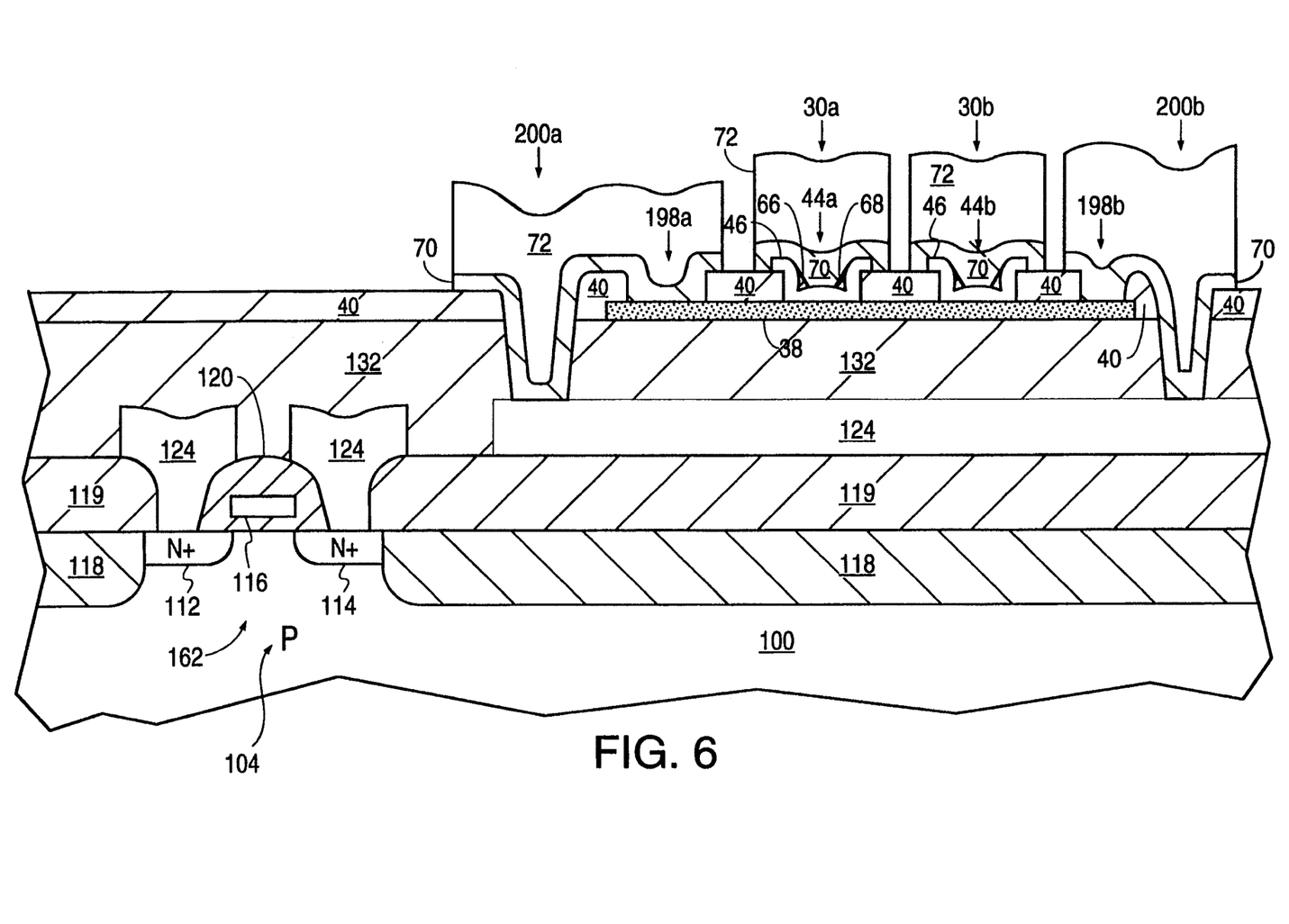
FIG. 6 is a cross-section illustration of a portion of a programmable CMOS integrated circuit having amorphous silicon antifuses in accordance with the present invention.

A cross-sectional view of a portion of a CMOS programmable gate array structure having an antifuse in accordance with the embodiment of FIG. 5 is illustrated in FIG. 6. Suitable CMOS processes are well known and commercially available, and the particular CMOS structure shown is exemplary. The antifuse 30 of FIG. 5 can be used in integrated circuit structures of any type formed by any process, whether memory, logic, digital or analog, and including NMOS, PMOS, Bipolar, BICMOS, Gallium Arsenide, and others.

Substrate 100 is processed using standard CMOS process steps up to, but not including, the formation of the first-level routing channels, so as to form logic and I/O circuits on the substrate. In particular, as shown in FIG. 6, substrate 100 is provided with a P-doped substrate region 104. An NMOS device 162 that forms part of the logic and I/O circuits comprises source and drain regions 112 and 114 and gate 116. Patterned oxide layers 118, 119 and 120 (shown in cross hatch) also are present. As is well known in the art, oxide layer 118 is a field oxide, boro-phosphosilicate glass layer 119 is a contact oxide, and oxide layer 120 comprises various oxide layers (not shown) formed in the fabrication of gate 116. The oxide layers 118, 119 and 120 are suitably patterned and etched to form contact holes down to the various source and drain regions including regions 112 and 114.

Using standard techniques, a film 124 of aluminum measuring about 6000 angstroms is sputtered over the patterned oxide layers and into the contact holes to regions 112 and 114. Other metals may be used as well, as is well known in the art. The lower metal lines are formed by patterning and etching aluminum film 124 using a C12 standard aluminum dry etch. The lower metal lines provide first-level routing channels that are connected to select input and output terminals of the logic and I/O circuits.

The intermetal dielectric is an oxide layer 132 of about 9000 angstroms thickness, deposited using any suitable standard technique such as, for example, plasma enhanced chemical vapor deposition. In one of many suitable techniques, the layer 132 comprises two oxide layers (not shown). The first oxide layer is deposited to the selected thickness and planarized. The planarization step involves spinning a resist layer over the deposited oxide and reflowing the resist with a postbake, after which the surface is planarized in an RIE etch-back adjusted for equal resist and oxide etch rates. A second oxide layer then is deposited to ensure dielectric integrity and the 9000 angstrom thickness over the irregular topography.

Antifuses 30a and 30b are formed over the intermetal dielectric 132. By this time, the formation of lower metal lines 124 and intermetal dielectric 132 has been completed. Therefore, antifuses 30 are not affected by the high temperatures present at the formation of the lower metal lines 124 and the intermetal dielectric 132. Further, no protective cover for the CMOS circuit elements is needed as the circuit elements are protected by the intermetal dielectric 132.

Antifuses 30 are formed as follows. A first metal layer 38 is deposited and patterned. The first metal layer 38 corresponds to the first conductive layer 38 of FIGS. 2–5 and provides the bottom electrode for the antifuses. In one embodiment, the first metal layer 38 is TiW, about 2000 angstroms thick, deposited by sputtering.

A dielectric layer 40 is formed on the first metal layer 38. In one embodiment, dielectric layer 40 is a layer of silicon dioxide, about 3000 angstroms thick, deposited using PECVD. Dielectric layer 40 is patterned to form antifuse vias 44a and 44b and contact vias 198a and 198b, exposing the first metal layer 38. 1600 angstrom layer 46 of amorphous silicon is deposited and patterned over the antifuse vias 44a and 44b. In some embodiments, amorphous silicon layer 46 is deposited by PECVD as described above in connection with FIG. 2.

Then the spacers are formed. A substantially conformal layer of silicon dioxide, about 2000 angstroms thick, is deposited by PECVD over the amorphous silicon layer 46 and etched using RIE to form spacers 66 and 68 on the sidewalls of via 44a and similar spacers on the sidewalls of via 44b. The spacers smooth the surface above the amorphous silicon 46.

Using standard photolithography and etching techniques, vias 200a and 200b are formed in the dielectric layer 40 and the intermetal dielectric layer 132. Vias 200 terminate at the lower metal layer 124. Vias 200 will allow a plurality of connections between the first metal layer 38 and the lower metal layer 124.

An about 2000 angstrom layer 70 of TiW and an about 8000 angstrom layer 72 of aluminum-copper are sputter deposited and patterned by standard techniques to form the second metal lines that provide a second level of conductive routing channels and the top electrodes. The second-level channels are connected to select input and output terminals of the logic and I/O circuits. The portions of layers 70 and 72 in vias 44 provide the top electrodes for antifuses 30. The portions of layers 70 and 72 in vias 198 and 200 and between vias 198 and 200 provide spaced-apart connections between the first TiW layer 38 and the lower aluminum layer 124. These connections reduce the connection resistance for antifuses 30. See generally U.S. Pat. No. 4,914,055, issued Apr. 3, 1990 to Gordon et al. The disclosure of U.S. Pat. No. 4,914,055 is hereby incorporated herein by reference hereto.

Using standard techniques, a 5000 angstrom layer of silicon dioxide (not shown) is deposited and pad openings are patterned. Then a 10000 angstrom layer of silicon nitride (not shown) is deposited and pad openings are patterned. These oxide and nitride layers are used as protective layers. The structure is then alloyed at 400° C. using standard techniques.

The circuit of FIG. 6 is fast because the overall capacitance associated with the metal layers is reduced. While, during the circuit operation, the middle layer 38 and the top layer 70, 72 may have different potentials, the middle layer 38 and the bottom layer 124 are at the same potential since the two layers are connected to each other. Therefore, the capacitance between the middle layer 38 and the bottom layer 124 is zero. The overall capacitance is therefore reduced, and the circuit speed is increased as a result.

Figure 7:
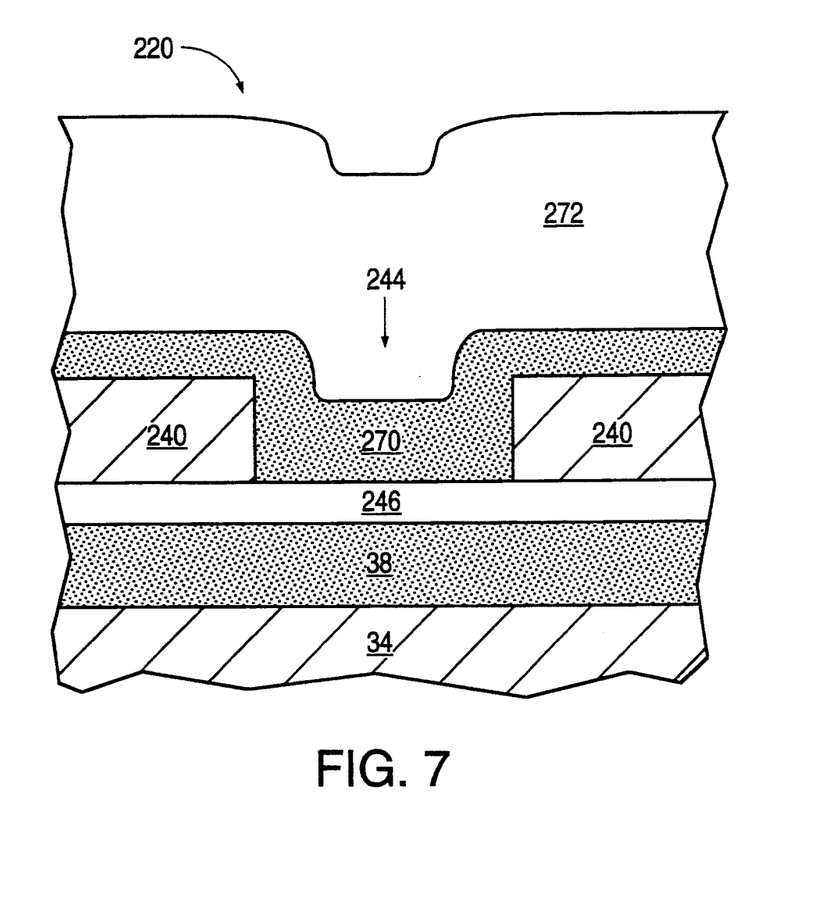
FIG. 7 is a cross-section illustration of another amorphous silicon antifuse in accordance with the present invention.

FIG. 7 shows another amorphous silicon antifuse 220. Antifuse 220 includes a first dielectric layer 34 formed on the silicon substrate (not shown) or on a lower conductive layer (not shown) as described above in connection with FIG. 2. First conductive layer 38 is deposited over dielectric layer 34 as described above in connection with FIG. 2. The first conductive layer 38 is a layer of a barrier metal such as TiW. Other conductive materials may be used. See the discussion above in connection with FIG. 2.

A layer 246 of amorphous silicon is deposited and patterned. The thickness of amorphous silicon layer 246 is 1600 angstroms in one embodiment. The amorphous silicon layer 246 is deposited in some embodiments using PECVD similarly to amorphous silicon layer 46 in antifuse 30 of FIG. 5.

A second dielectric layer 240 is formed on amorphous silicon layer 246. In one embodiment, second dielectric layer 240 is a layer of silicon dioxide, about 3000 angstroms thick, deposited using PECVD. The second dielectric layer 240 is patterned to form vias, such as via 244, exposing the amorphous silicon 246. These vias, in particular via 244, will serve as sites for antifuses.

An about 2000 angstrom layer 270 of TiW and an about 8000 angstrom layer 272 of aluminum-copper are sputter deposited and patterned to form the top electrode. TiW layer 270 serves to prevent the aluminum of AlCu layer 272 from spiking into the amorphous silicon 246. Aluminum spikes would increase the leakage current or even short the antifuse 220.

The amorphous silicon layer 246 in antifuse 220 is planar, so the problem of thinning amorphous silicon in the antifuse via corners does not exist. The planarity of the amorphous silicon layer makes the electrical characteristics uniform across the antifuse via.

Antifuse 220 can be used in place of, or with, antifuse 30 in the structure of FIG. 6.

While the invention has been described with respect to the embodiments included above, other embodiments and variations not described herein may be considered to be within the scope of the invention. For example, the invention should not be limited by the composition of the metal system used for the interconnects, or to any specific thickness of the various films and oxides used in the structure. These other embodiments and variations are to be considered within the scope of the invention, as defined by the following claims.

What is claimed is:

1. A method for fabricating a programmable interconnect structure for an integrated circuit having a plurality of devices, comprising the steps of:
    fabricating a first conductor;
    fabricating an insulating layer overlaying said first conductor;
    fabricating an opening through said insulating layer at a selected location and terminating said opening at a portion of said first conductor;
    depositing a film of a programmable material upon said insulating layer and in said opening, said programmable material being non-conductive when said structure is unprogrammed, said programmable material providing a conductive path therethrough when said structure is programmed;
    patterning said programmable material film to form at said selected location a programmable material feature, said feature having a region contacting and fully overlaying said first conductor portion;
    fabricating spacers over sidewalls of said opening, said spacers overlaying at least a portion of said programmable material film; and
    fabricating a second conductor, wherein a portion of said second conductor contacts and overlays said programmable material region and wherein a portion of said second conductor overlays said spacers.

2. A method as in claim 1 wherein said spacers smooth a surface of said programmable material feature.

3. A method as in claim 1 wherein said spacers incompletely cover a portion of said programmable material feature on a bottom of said opening.

4. A method as in claim 3 wherein said spacers cover a portion of said programmable material film in bottom corners of said opening.

5. A method as in claim 1 wherein said spacers are fabricated from silicon dioxide.

6. A method as in claim 1 wherein said spacers are fabricated from silicon nitride.

7. A method as in claim 1 wherein said spacer fabricating step comprises the steps of:
    depositing a substantially conformal layer of material upon said programmable material feature; and
    anisotropically etching said conformal layer.

8. A method as in claim 7 wherein said conformal layer depositing step comprises the step of depositing silicon dioxide using plasma enhanced chemical vapor deposition.

9. A method as in claim 7 wherein said conformal layer of material is a layer of silicon dioxide about 2,000 angstroms thick.

10. A method as in claim 7 wherein said etching step comprises the step of using reactive ion etching to etch said conformal layer.

11. A method as in claim 1 wherein said depositing step comprises the step of depositing a film of amorphous silicon by plasma enhanced chemical vapor deposition.

12. A method as in claim 1 wherein said first conductor comprises a barrier metal.

13. A method as in claim 1, wherein said first conductor is TiW.

14. A method as in claim 1 wherein said second conductor comprises a barrier metal.

15. A method as in claim 1 wherein said second conductor is TiW.

16. A method as in claim 1 wherein said step of fabricating a second conductor comprises the steps of:
depositing a layer of barrier metal; and
depositing a layer of aluminum-copper on top of said layer of barrier metal.

17. A method as in claim 16 wherein said step of depositing a layer of barrier metal comprises the step of depositing a layer of TiW about 2,000 angstroms thick by sputtering.

18. A method for fabricating a programmable interconnect structure for an integrated circuit having a plurality of devices, comprising the steps of:
fabricating a first conductor;
depositing a film of programmable material upon said first conductor, said programmable material being non-conductive when said structure is unprogrammed, said programmable material providing a conductive path therethrough when said structure is programmed;
fabricating an insulating layer overlaying said programmable material film;
fabricating an opening through said insulating layer at a selected location and terminating said opening at a portion of said programmable material film; and
fabricating a second conductor in said opening, wherein a portion of said second conductor contacts and overlays at least a portion of said programmable material film.

19. A method as in claim 18 wherein said depositing step comprises the step of depositing amorphous silicon by plasma enhanced chemical vapor deposition.

20. A method as in claim 18 wherein said first conductor comprises a barrier metal.

21. A method as in claim 18 wherein said first conductor comprises TiW.

22. A method as in claim 18 wherein said second conductor comprises a barrier metal.

23. A method as in claim 18 wherein said second conductor comprises TiW.

24. A method as in claim 18 wherein said step of fabricating a second conductor comprises the steps of:
depositing a layer of barrier metal; and
depositing a layer of aluminum-copper on top of said layer of barrier metal.

25. A method as in claim 24 wherein said step of depositing a barrier metal comprises the step of depositing TiW.

26. A method for fabricating a programmable integrated circuit, comprising the steps of:
forming circuit elements in a substrate;
depositing over said substrate and patterning a first conductive layer so as to form a first level of routing channels, said first level channels being connected to selected circuit elements;
forming a first insulating layer overlaying said first conductive layer; and
forming a programmable interconnect structure overlaying said first insulating layer, said programmable interconnect structure being connected to selected circuit elements, said programmable interconnect structure comprising one or more antifuses.

27. The method of claim 29 wherein said step of forming a programmable interconnect structure comprises the steps of:
forming a conductor overlaying said first insulating layer, said conductor providing a first electrode to each antifuse;
forming a second insulating layer overlaying said conductor;
forming first openings and second openings through said second insulating layer at selected locations, said second openings terminating at said conductor;
forming a programmable material overlaying and contacting said conductor, said programmable material being non-conductive when said antifuses are unprogrammed, said programmable material providing at least one conductive path therethrough when at least one of said antifuses is programmed;
forming third openings, each third opening passing through said first and second insulating layers and terminating at said first conductive layer; and
depositing and patterning a second conductive layer so as to form a second level of conductive routing channels, said second level channels being connected to selected circuit elements, said second conductive layer having a first portion in said first openings, said first portion overlaying and contacting said programmable material and being separated from said conductor by said programmable material, said first portion providing a second electrode to each antifuse, said second conductive layer having a second portion electrically insulated from said first portion, said second portion contacting said conductor through said second openings and said first conductive layer through said third openings so as to reduce connection resistance for said conductor.

28. A method as in claim 27 wherein said programmable material forming step comprises the steps of:
depositing a film of amorphous silicon upon said second insulating layer; and
patterning said amorphous silicon film to form an amorphous silicon feature overlaying sidewalls of said first openings and a portion of said conductor at bottoms of said first openings; and
said method further comprises, prior to said step of depositing a second conductive layer, the step of forming spacers on sidewalls of said first openings, said spacers overlaying at least a portion of said amorphous silicon film.

29. A method as in claim 27 wherein said programmable material forming step precedes said step of forming a second insulating layer and comprises the step of depositing a film of programmable material upon said conductor.

30. A method as in claim 27 wherein said first conductive layer comprises aluminum and said conductor comprises TiW.

31. A method as in claim 27 wherein a portion of said first insulating layer is uncovered by said conductor; and said step of forming third openings comprises the step of forming said third openings through said uncovered portion of said first insulating layer.

32. The method of claim 1 wherein said programmable material comprises amorphous silicon.

33. The method of claim 18 wherein said programmable material comprises amorphous silicon.

* * * * *

UNITED STATES PATENT AND TRADEMARK OFFICE
CERTIFICATE OF CORRECTION

PATENT NO.   : 5,362,676
DATED        : November 8, 1994
INVENTOR(S)  : Gordon et al.

It is certified that error appears in the above-identified patent and that said Letters Patent is hereby corrected as shown below:

Col. 10, line 19, delete "29" and insert --26--.

Signed and Sealed this

Twenty-second Day of August, 1995

Attest:

Attesting Officer

BRUCE LEHMAN

Commissioner of Patents and Trademarks